United States Patent [19]

Shou et al.

[11] Patent Number: 5,602,499

[45] Date of Patent: Feb. 11, 1997

[54] MULTISTAGE SWITCHING CIRCUIT

[75] Inventors: Guoliang Shou; Sunao Takatori; Makoto Yamamoto, all of Tokyo, Japan

[73] Assignees: Yozan Inc., Tokyo; Sharp Corporation, Osaka, both of Japan

[21] Appl. No.: 619,416

[22] Filed: Mar. 21, 1996

Related U.S. Application Data

[63] Continuation of Ser. No. 308,456, Sep. 19, 1994.

[30] Foreign Application Priority Data

Sep. 20, 1993 [JP] Japan .................................. 5-256397
Sep. 20, 1993 [JP] Japan .................................. 5-256540

[51] Int. Cl.$^6$ .......................... H03K 17/693; H03K 5/24
[52] U.S. Cl. .................... 327/75; 327/407; 327/408
[58] Field of Search ........................... 327/74, 75, 407, 327/408, 411, 77, 78, 79, 80

[56] References Cited

U.S. PATENT DOCUMENTS

| | | | |
|---|---|---|---|
| 4,031,506 | 6/1977 | Siems | 340/15.5 GC |
| 4,183,016 | 1/1980 | Sawagata | 327/75 |
| 4,507,578 | 3/1985 | Matsuda | 307/520 |
| 4,903,028 | 2/1990 | Fukushima | 327/75 |
| 4,989,003 | 1/1991 | Sauer | 341/136 |
| 5,170,076 | 12/1992 | Smith | 307/354 |
| 5,262,686 | 11/1993 | Korosawa | 307/362 |
| 5,281,860 | 1/1994 | Krenik et al. | 327/407 |
| 5,302,869 | 4/1994 | Hosotani et al. | 327/75 |
| 5,367,266 | 11/1994 | Kang | 327/47 |
| 5,408,142 | 4/1995 | Takatori et al. | 327/91 |
| 5,408,422 | 4/1995 | Takatori et al. | 327/94 |
| 5,416,370 | 5/1995 | Takatori et al. | 327/356 |
| 5,416,439 | 5/1995 | Shou et al. | 327/356 |
| 5,440,605 | 8/1995 | Shou et al. | 327/407 |
| 5,444,411 | 8/1995 | Yang et al. | 327/361 |
| 5,457,417 | 10/1995 | Shou et al. | 327/356 |

OTHER PUBLICATIONS

IBM–Technical Disclosure Bulletin, H. M. Beisner, "Analog-to-Digital Conversion Device", Apr. 1965, vol. 7, No. 11, pp. 1054–1055.

Souda, Yasushi, "91 The CMOS Device Manual", CQ Shuppansha, 1991, pp. 102–103 108–109 and 142.

*Primary Examiner*—Timothy P. Callahan
*Assistant Examiner*—Eunja Shin
*Attorney, Agent, or Firm*— Cushman, Darby & Cushman IP Group of Pillsbury Madison & Sutro LLP

[57] ABSTRACT

An analog type multistage switching circuit with a small circuit size and a small consumed electric power to having a plurality of thresholding circuits arranged in parallel to which an input voltage and a reference voltage are impressed through capacitive couplings which add the input voltage and reference voltage with weighting.

3 Claims, 3 Drawing Sheets

MULTISTAGE SWITCHING CIRCUIT

This is a continuation of application Ser. No. 08/308,456, filed on Sep. 19, 1994.

FIELD OF THE INVENTION

The present invention relates to a multistage switching circuit for determining an ON/OFF status of a plurality of switching circuits using inputted analog data.

The present invention relates to a multiplexer for selectively outputting one of plurality of signal voltages corresponding to an analog input voltage impressed as a control signal.

BACKGROUND OF THE INVENTION

A multistage switching circuit is used as a decoder or multiplexer in a conventional digital computer. A decoder selects a single decoder signal from among plurality of inputted data signals based on a control signal.

A multiplexer in a conventional digital computer receiver a control signal having a plurality of bits each corresponding to a plurality of input signals, and selectively outputs one of the input signals corresponding to the bit specified in the control signal.

However, because conventional digital computers are driven by current, they consume a large amount of electric power. Also, the circuit size of a conventional digital computer becomes excessively large as the number of input data signals and corresponding bits are increased.

SUMMARY OF THE INVENTION

The present invention provides an analog type multistage switching circuit with a small circuit size and a small consumed electric power.

A multistage switching circuit according to the present invention has thresholding circuits arranged in parallel to which an input voltage and a reference voltage are impressed through capacitive couplings, the capacitive couplings weighting and adding the input voltage and reference voltage.

PREFERRED EMBODIMENT OF THE INVENTION

Hereinafter, an embodiment of a multistage switching circuit according to the present invention is described with referring to the attached drawings.

Figure 1:
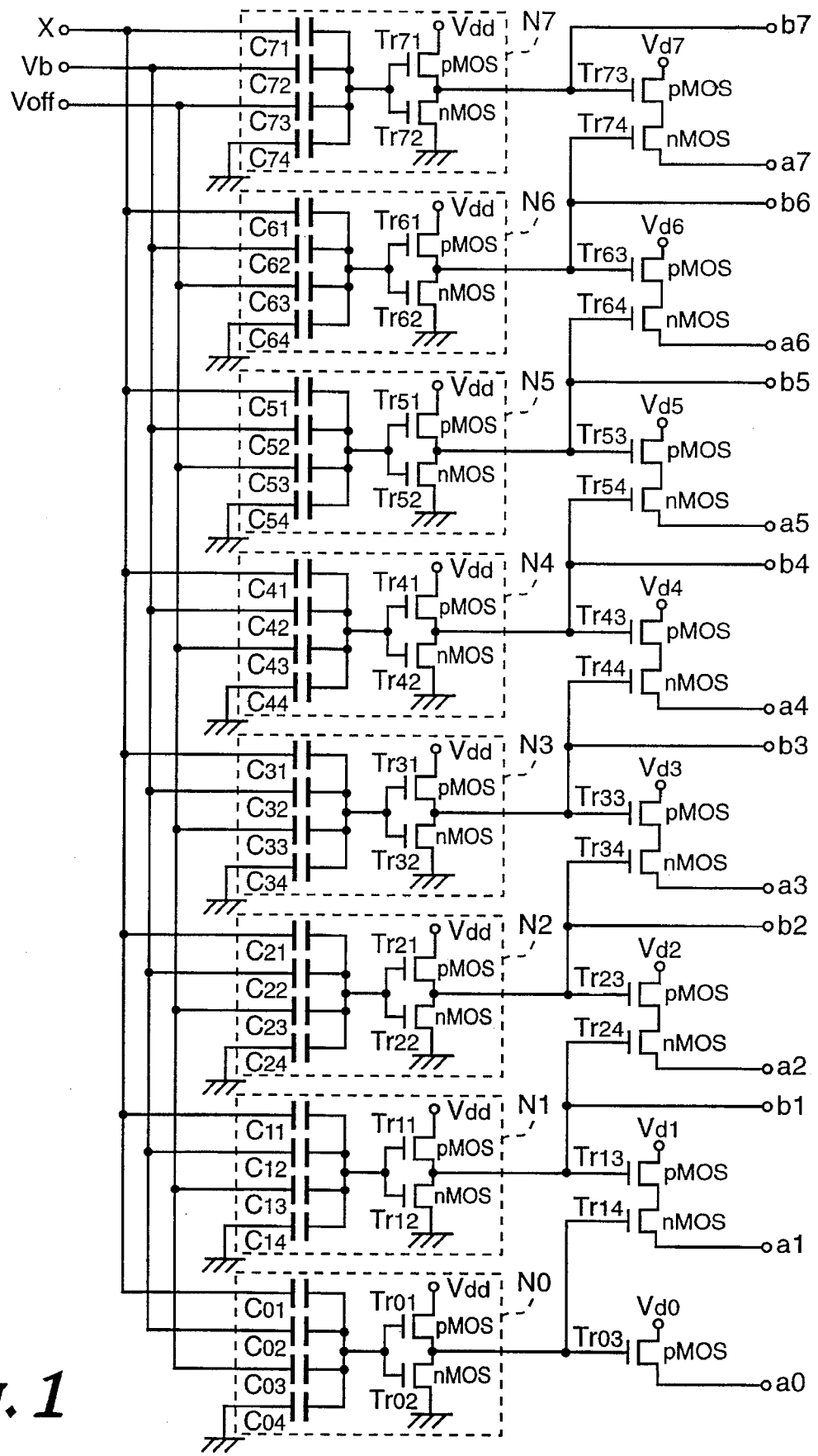
FIG. 1 is a circuit diagram showing the first embodiment of a multistage switching circuit according to the present invention.

FIG. 1 shows a multistage switching circuit composed of thresholding circuits N0 to N7 connected in parallel, and input voltage X, offset voltage Voff and reference voltage Vb as a control signal are impressed to each thresholding circuit.

Each thresholding circuit N0 to N7 of the multistage switching circuit consists of a capacitive coupling with four capacitors and an amplifier circuit having a CMOS inverter.

Thresholding circuit N0 has a capacitive coupling with four capacitors connected in parallel: capacitor C01 receives input voltage X, capacitor C02 receives offset voltage Voff, capacitor C03 receives reference voltage Vb and capacitor C04 is earthed. The output terminal of the capacitive coupling is connected to an amplifier circuit.

The amplifier circuit consists of pMOS type transistor Tr01 and nMOS type transistor Tr02. Bias voltage Vdd is impressed to a drain of the pMOS type transistor Tr01, and its source is connected to a drain of the nMOS type transistor Tr02. The bias voltage Vdd is common for all thresholding circuits. An output having the same value is generated when any one of the thresholding circuits fires. A gate of both transistors are commonly connected to a capacitor, and a source of nMOS type transistor Tr02 is earthed. Other thresholding circuits N1 to N7 are similar to N0, with four capacitors and two transistors.

Capacitors C01, C11, C21, C31, C41, C51, C61 and C71 to which input voltage X of each thresholding circuit is impressed have the same capacity, and capacitors C03, C13, C23, C33, C43, C53, C63 and C73 to which offset voltage Voff is impressed have the same capacity. The offset voltage is input to simultaneously control the threshold voltage of each thresholding circuit. That is, if an offset voltage Voff is arranged high, each thresholding circuit fires by rather low input voltage. On the other hand, by arranging an offset voltage Voff to be low, the thresholding circuit fires by higher input voltage than the above.

The capacitance of capacitors C02, C12, C22, C32, C42, C52, C62 and C72 to which reference voltage impresses are stepwisely arranged. The thresholding circuits fire from lower threshold to higher threshold one after another. In FIG. 1, thresholding circuits fire from the top to the bottom as the threshold voltages increase. The thresholding circuits sequentially fire from N7 to N0 as the input voltage X increases.

The capacitance of earthed capacitors C04, C14, C24, C34, C44, C54, C64 and C74 are predetermined to offset a change of capacitor to which the reference voltage is impressed. When capacitors of thresholding circuits are represented by Ck0, Ck1, Ck2 and Ck3 (k:0 to 7), the following Formula 1 is given for all the thresholding circuits, then output voltage Vc of parallelly connected capacitor is defined by Formula 2.

$$Ck0+Ck1+Ck2+Ck3=K \text{ (K is a constant number.)} \quad (1)$$

$$Vc=(Ck0X+Ck1Voff+Ck2Vb)/(Ck0+Ck1+Ck2+Ck3) \quad (2)$$

In order to change a firing threshold value of each thresholding circuit, it is also possible to change a capacity of capacitor Ck2 without changing capacitor Ck3. However, there are problems: minute arrangement is not easy because both of the numerator and denominator of Formula 2 are changed in response to the change of CK2. The design of LSI circuit will be complicated because the total capacity of capacitive couplings for thresholding circuits are different from one another. In order to prevent each inconvenience, a capacity of each capacitive coupling is predetermined to satisfy Formula 1.

The thresholding circuits N0 to N7 are connected at their outputs to pMOS type transistors Tr03, Tr12, Tr23, Tr33, Tr43, Tr53, Tr63 and Tr73. A switching signal is outputted from a source of pMOS when the pMOS type transistor is ON in response to firing of each threshold circuit. Signal voltage Vd0, Vd1, Vd2, Vd3, Vd4, Vd5, Vd6 and Vd7 are impressed to a drain of pMOS type transistors, respectively. Drain voltages equal to or different from one another corresponding to control objects controlled by the switching signals.

The thresholding circuits N1 to N7 have nMOS type transistors Tr14, Tr24, Tr34, Tr44, Tr54, Tr64 and Tr74, which are connected at their drains to the source of pMOS type transistors. A signal from the source of these nMOS type transistors are used as switching signal a1, a2, a3, a4, a5, a6 and a7.

Each of nMOS type transistors Tr14 to Tr74 is connected at its gate with an output of the thresholding circuit having higher threshold by one step then the threshold circuit to which its drain is connected.

Each of pMOS Tr03 to Tr73 transistors is also connected at its gate with the output of an associated thresholding circuit, transistors Tr03 and Tr14, Tr13 and Tr24, Tr23 and Tr34, Tr33 and Tr44, Tr43 and Tr54, Tr53 and Tr64, Tr63 and Tr74 being respectively connected to outputs of the same thresholding circuits. When a thresholding circuit fires, the associated pMOS transistor (e.g. Tr03) becomes conductive and the associated nMOS transistor (e.g. Tr14) becomes non-conductive. Only one thresholding circuit fires because the firing circuit prevents the lower circuit from firing.

Thresholding circuit N0 uses a signal from a source of pMOS type transistor Tr03 as a switching signal a0, there is not provided a nMOS type transistor for controlling the output because N0 is the circuit of the highest threshold value.

Each thresholding circuit N1 to N7 has a terminal for outputting a corresponding switching signal b1 to b7. The switching signals b1 to b7 are not exclusive signals as the signals a0 to a7, and all switching signals from firing thresholding circuits are ON.

TABLEs 1 and 2 show ON/OFF conditions of a value of input voltage X, switching signals a0 to a7 and switching signals b1 to b7. In the TABLEs, "1" means ON, and "0" means OFF. Offset voltage Voff impressed to each thresholding circuit is 2.5 V.

TABLE 1

| INPUT VOLTAGE X(V) | a0 | a1 | a2 | a3 | a4 | a5 | a6 | a7 |
|---|---|---|---|---|---|---|---|---|
| X ≧ 6.0 | 1 | 0 | 0 | 0 | 0 | 0 | 0 | 0 |
| 6.0 > X ≧ 5.5 | 0 | 1 | 0 | 0 | 0 | 0 | 0 | 0 |
| 5.5 > X ≧ 5.0 | 0 | 0 | 1 | 0 | 0 | 0 | 0 | 0 |
| 5.0 > X ≧ 4.5 | 0 | 0 | 0 | 1 | 0 | 0 | 0 | 0 |
| 4.5 > X ≧ 4.0 | 0 | 0 | 0 | 0 | 1 | 0 | 0 | 0 |
| 4.0 > X ≧ 3.5 | 0 | 0 | 0 | 0 | 0 | 1 | 0 | 0 |
| 3.5 > X ≧ 3.0 | 0 | 0 | 0 | 0 | 0 | 0 | 1 | 0 |
| 3.0 > X ≧ 2.5 | 0 | 0 | 0 | 0 | 0 | 0 | 0 | 1 |
| 2.5 > X | 0 | 0 | 0 | 0 | 0 | 0 | 0 | 0 |

TABLE 2

| INPUT VOLTAGE X(V) | b0 | b1 | b2 | b3 | b4 | b5 | b6 | b7 |
|---|---|---|---|---|---|---|---|---|
| X ≧ 6.0 | 1 | 1 | 1 | 1 | 1 | 1 | 1 | 1 |
| 6.0 > X ≧ 5.5 | 0 | 1 | 1 | 1 | 1 | 1 | 1 | 1 |
| 5.5 > X ≧ 5.0 | 0 | 0 | 1 | 1 | 1 | 1 | 1 | 1 |
| 5.0 > X ≧ 4.5 | 0 | 0 | 0 | 1 | 1 | 1 | 1 | 1 |
| 4.5 > X ≧ 4.0 | 0 | 0 | 0 | 0 | 1 | 1 | 1 | 1 |
| 4.0 > X ≧ 3.5 | 0 | 0 | 0 | 0 | 0 | 1 | 1 | 1 |
| 3.5 > X ≧ 3.0 | 0 | 0 | 0 | 0 | 0 | 0 | 1 | 1 |
| 3.0 > X ≧ 2.5 | 0 | 0 | 0 | 0 | 0 | 0 | 0 | 1 |
| 2.5 > X | 0 | 0 | 0 | 0 | 0 | 0 | 0 | 0 |

The above switching signals can be used for controlling other elements and circuits than the thresholding circuits. As a digital signal with 8 bits, it can be used as address designation of memory element of a digital circuit. In the latter case, a multistage switching circuit of the embodiment functions as an effective A/D converter.

Figure 2:
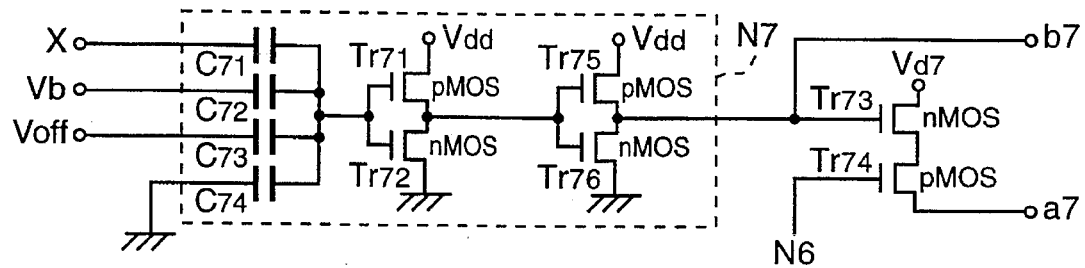
FIG. 2 is a circuit diagram showing the second embodiment of a multistage switching circuit according to the present invention.

FIG. 2 shows the second embodiment of a multistage switching circuit of the present invention. FIG. 2 shows only single thresholding circuit N7. Actually, it is used by multistage combination as FIG. 1. Thresholding circuit N7 in the second embodiment includes the first amplifier circuit consisting of 4 capacitors C71, C72, C73 and C74 connected in parallel, pMOS type transistors Tr71, nMOS type transistor Tr72, and the second amplifier circuit with transistors Tr75 and Tr76.

This embodiment is different from the first embodiment in that it presents 2 stages of amplifier circuit functioning as an invertor so that the polarity of its output is reversed to the first embodiment. Then, the transistor Tr73 receiving an output of thresholding circuit N7 is nMOS type transistor and transistor Tr74 for controlling an output of signal a7 by an output of thresholding circuit N6 with high threshold is pMOS type transistor.

In the second embodiment, switching signals can be outputted similar to the first embodiment, which can be used as a controlling means of various kind of systems based on an analog control signal.

Figure 3:
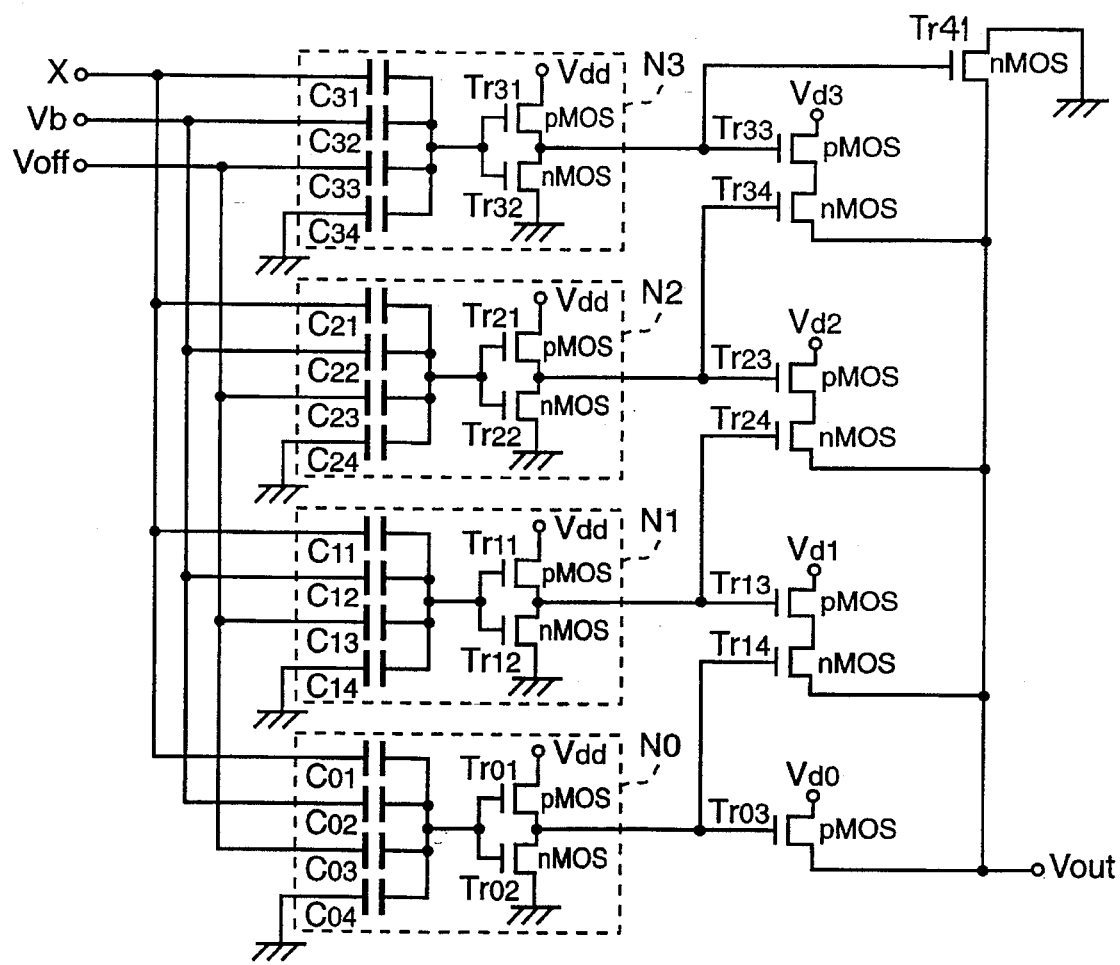
FIG. 3 is a circuit diagram showing the first embodiment of a multiplexer relating to the present invention.

FIG. 3 shows the third embodiment as a multiplexer consisting of 4 thresholding circuits connected in parallel N0' to N3', and input voltage X', offset voltage Voff' and reference voltage Vb' are commonly inputted to the thresholding circuits as control signals.

Each of the thresholding circuits N0' to N3' consists of 4 capacitors connected in parallel and an amplifier circuit with 2 MOS type transistors.

The thresholding circuit N0' is composed of four capacitors connected in parallel: capacitor C01' being impressed input voltage X', capacitor C02' being impressed offset voltage Voff', capacitor C03' being impressed reference voltage Vb' and capacitor C04' being earthed. The output of the capacitors are commonly connected to an amplifier circuit.

Bias voltage Vdd' is impressed on a drain of pMOS type transistor Tr01' composing an amplifier circuit, and its source is connected to a drain of nMOS type transistor Tr02'. The bias voltages Vdd for all thresholding circuits are equal to one another. An output having the same value is generated when any one of thresholding circuits fires. A gate of both transistors is connected to each other and connected to capacitor, and a source of nMOS type transistor Tr02' is earthed. Other thresholding circuits N1' to N7' have similar compositions of 4 capacitors and 2 transistors.

Capacitors, to which input voltage X' of each thresholding circuit is impressed, C01', C11', C21', C31', C41', C51', C61' and C71' have the same capacity. Capacitors being impressed offset voltage $V_{off}$, C03', C13', C23, C33', C43', C53', C63' and C73' have the same capacity. The offset voltage is determined so that the inputted voltage, as a control signal, is shifted by shifting a threshold value of each thresholding circuit in the same time. That is, if an offset voltage Voff' is high, impressing of comparatively low input exceeds a threshold value of each thresholding circuit causing those circuits to fire. On the other hand, if an offset voltage Voff' is low, and the input voltage X' is not high, there is no circuit to fire.

On the other hand, the capacitance of capacitors, to which reference voltage impresses $V_{ref}$, C02', C12', C22', C32', C42', C52', C62' and C72' are stepwisely arranged so that the outputs of the thresholding circuits are inverted in response to increase of input voltage X'. In FIG. 3, thresholding circuits are arranged from the top to the bottom as the threshold voltages increase. The thresholding circuits sequentially fire from N7' as the input voltage X' increases.

The capacitance of earthed capacitors C04', C14', C24', C34', C44', C54', C64' and C74' are predetermined to offset a change of capacitor to which the reference voltage is impressed. When capacitors of thresholding circuits are represented by Ck0', Ck1', Ck2' and Ck3' (k:0' to 7'), the following Formula 3 is given for all the thresholding circuits, then output voltage Vc' of capacitors connected in parallel is shown by Formula 4.

$$Ck0'+Ck1'+Ck2'+Ck3'=K \text{ (K is a constant number.)} \quad (3)$$

$$Vc=(Ck0X'+Ck1Voff'+Ck2Vb')/(Ck0'+Ck1'+Ck2'+Ck3') \quad (4)$$

In order to change a firing threshold value of each thresholding circuit, it is also possible to change a capacity of capacitor Ck2' without changing capacitor Ck3'. However, there are problems; minute arrangement is not easy because both of the numerator and denominator of Formula 4 are changed in response to the change of CK2'. The design of LSI circuit will be complicated because the total capacity of capacitive couplings for thresholding circuits are different from one another. In order to prevent each inconvenience, a capacity of each capacitive coupling is predetermined to satisfy Formula 3.

The thresholding circuits N0' to N3' are connected at their outputs to pMOS type transistors Tr03', Tr13', Tr23' and Tr33' which are the first switching means. A switching signal is outputted from a source of pMOS when the pMOS type transistor is ON in response to firing of each threshold circuit. Signal voltage Vd0', Vd1', Vd2' and Vd3' are impressed to a drain of pMOS type transistors, respectively. Drain voltages are usually different from one another, which represent the signal to be selected.

The thresholding circuits N1' to N3' have nMOS type transistors Tr14' Tr24' and Tr34', which are connected at their drains to the source of pMOS type transistors. The source of these nMOS type transistors are used as the second switching means. The source of these nMOS type transistors and the source of pMOS type transistor Tr03' corresponding to the first thresholding circuit are connected each other and they have common output Vout'.

Each of nMOS type transistors Tr14, Tr24 and Tr34 is connected at its gate with the output of the thresholding circuit with higher threshold by one step.

One pMOS transistor is connected at its gate with an output of the thresholding circuit of higher threshold by one step. When the higher thresholding circuit fires, pMOS becomes conductive and nMOS becomes non-conductive. Then, output voltage Vout' becomes one of signal voltages Vd0', Vd1', Vd2' and Vd3'.

An output of thresholding circuit N3' of the lowest threshold receives an output of thresholding circuit N3' at its gate, its source is earthed ad its drain is connected to nMOS transistor Tr34' connected at the above common output.

The transistor is arranged to prevent the common output from being unstable. It is not necessary to arrange it when the minimum voltage of input voltage X' is higher than the above predetermined voltage.

TABLE 3 shows a relationship between values of input voltage X' and output voltage Vout'. When an input voltage becomes higher, then output voltage switches from Vd3', in the order of Vd2', Vd1' to Vd0'. Offset voltage Voff' impressed to each thresholding circuit is 2.5 V.

TABLE 3

| INPUT VOLTAGE X' (V) | OUTPUT VOLTAGE Vout' |
|---|---|
| X'≧4.0 | Vd0' |
| 4.0 >X' ≧3.5 | Vd1' |
| 3.5 >X' ≧3.0 | Vd2' |
| 3.0 >X' ≧2.5 | Vd3' |
| 2.5 > X' | 0' |

The above multiplexer of the third embodiment stepwisely generates outputs in each threshold arranged beforehand and the arrangement of the threshold is performed by capacitive coupling and inverters, therefore, a consumed electric power is small comparing with a conventional current driving type circuit.

Figure 4:
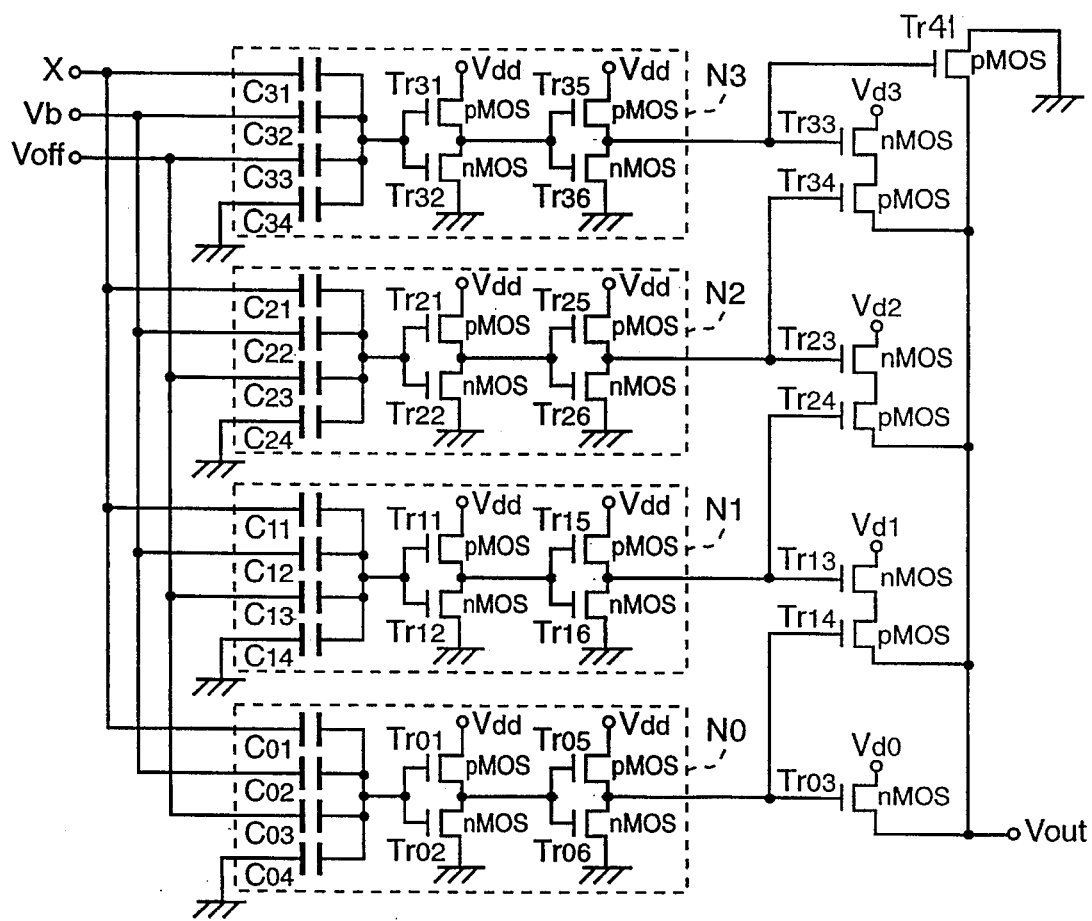
FIG. 4 is a circuit diagram showing the second embodiment of a multiplexer relating to the present invention.

FIG. 4 shows the forth embodiment of a multiplexer of the present invention. This embodiment is different from the third embodiment on the point that 2 stages amplifier circuits are arranged, which functions as an invertor in each thresholding circuit. Thresholding circuit N3' in the forth embodiment includes the first amplifier circuit consisting of 4 capacitances C31', C32', C33' and C34' connected in parallel, pMOS type transistor Tr31', nMOS type transistor Tr32', and the second amplifier circuit with transistors Tr35' and Tr36'.

In the forth embodiment, the polarity of its output is the opposite from the third embodiment because of the 2 stages of amplifier circuits. Then, the transistor Tr33' receiving an output of thresholding circuit N3' is nMOS type transistor and transistor Tr34' for controlling an output of signal a3' by output of thresholding circuit N6' with high threshold is pMOS type transistor.

In the above embodiment, one of 4 signal voltages inputted by 4 sets of thresholding circuits is selectively outputted according to the level of input voltage X'. The number of thresholding circuits can be arranged other than the embodiments above. It can be increased and decreased corresponding to the number of signal voltages.

As mentioned above, according to the present invention, consumed electric power can be reduced comparing with current driving type one and the circuit size can be smaller by selectively outputting one of a plural number of signals inputted according to the voltage inputted by a plural number of thresholding circuits using capacitors.

What is claimed is:

1. A multistage switching circuit comprising:

a plurality of thresholding circuits, each of which comprises:

a capacitive coupling for receiving an input voltage and a reference voltage, and for adding said voltages with weighting, and an inverter with a predetermined threshold for receiving an output generated by said capacitive coupling, and for generating a low level voltage when said output exceeds said threshold and a high level voltage when said output does not exceed said threshold; and a plurality of pMOS type transistors, each of which having a gate connected to an output of one of said thresholding circuits, a drain connected to a drain voltage, and a source connected to an output terminal, wherein said drain voltages of said pMOS type transistors are different from one another, and wherein each of said capacitive couplings has a different weight so that said voltage generated by said inverter changes in response to a change in said input voltage.

2. A multistage switching circuit comprising:

a plurality of thresholding circuits, each of which corresponding to a different threshold and each of which comprising:

a capacitive coupling for receiving an input voltage and a reference voltage, and for adding said voltages with weighting, and an inverter with a predetermined threshold for receiving an output generated by said capacitive coupling, and for generating a low level voltage when said output exceeds said threshold and a high level voltage when said output does not exceed said threshold;

a plurality of pMOS type transistors, each of which having a gate connected to an output of one of said thresholding circuits, and a drain connected to a drain voltage;

a plurality of nMOS type transistors, at least one of said nMOS transistors corresponding to each of said pMOS type transistors that are not associated with the thresholding circuit corresponding to a highest threshold, a source of each nMOS type transistor being connected to a source of said corresponding pMOS type transistor, a gate of each nMOS type transistor being connected to an output of said thresholding circuit corresponding to a higher threshold, a drain of each nMOS type transistor being used to output an output signal voltage, wherein each of said capacitive couplings has a different weight so that said voltage generated by said inverter changes in response to a change in said input voltage.

3. A multistage switching circuit as claimed in claim 2, wherein said drain voltages of said pMOS type transistors are different.

* * * * *